United States Patent
Katla et al.

(10) Patent No.: US 6,904,579 B2
(45) Date of Patent: Jun. 7, 2005

(54) REDUCING TIME TO MEASURE CONSTRAINT PARAMETERS OF COMPONENTS IN AN INTEGRATED CIRCUIT

(75) Inventors: Sreekantha Madhava Katla, Karnataka (IN); Vikas K. Prasad, Karnataka (IN); Suravi Bhowmik, Karnataka (IN); Kalpesh Amruthlal Shah, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 167 days.

(21) Appl. No.: 10/403,080

(22) Filed: Apr. 1, 2003

(65) Prior Publication Data

US 2004/0199888 A1 Oct. 7, 2004

(51) Int. Cl.[7] .............................................. G06F 17/50
(52) U.S. Cl. ............................................... 716/6; 716/4
(58) Field of Search ............................... 716/2, 4–6, 18; 703/19

(56) References Cited

U.S. PATENT DOCUMENTS 6,311,148 B1 * 10/2001 Krishnamoorthy ............. 716/6

* cited by examiner

*Primary Examiner*—Vuthe Siek
*Assistant Examiner*—Paul Dinh
(74) *Attorney, Agent, or Firm*—Alan K. Stewart; W. James Brady, III; Frederick J. Telecky, Jr.

(57) ABSTRACT

Reducing the time required to measure constraint parameters (setup time, hold time and pulse width) of components in integrated circuits. For example, the delay of propagation of a signal between an input node and an intermediate node of a component are measured. An approximate range of possible values is formulated, and a search (by applying signals assuming one of the values in the approximate range and examining the output signal(s)) is conducted within the range to determine the value of the constraint parameters.

3 Claims, 6 Drawing Sheets

US 6,904,579 B2

REDUCING TIME TO MEASURE CONSTRAINT PARAMETERS OF COMPONENTS IN AN INTEGRATED CIRCUIT

BACKGROUND OF THE INVENTION

1. Field of the Invention

The present invention relates to design methodologies used to implement integrated circuits, and more specifically to a method and apparatus for reducing time to measure constraint parameters of various components used in integrated circuits.

2. Related Art

Integrated circuits generally contain several components such as flip-flops and registers. It is often desirable to determine several characteristics of the components, for example, to determine a maximum clock speed at which an integrated circuit may be operated. Some of such characteristics of interest are constraint parameters. Constraint parameters generally refer to values specifying the minimum delay/duration between occurrence of two signals, with the reference signal being termed as a constraining signal and the other signal being referred to as a constrained signal.

For example, constraint parameters of interest with reference to sequential components (having memory, e.g. flip-flops) include setup time, hold time and minimum pulse width. As is well known, setup time generally refers to a minimal time duration a signal of interest (e.g., input signal as the constrained signal) is to reach a desired signal level ahead of a reference signal (constraining signal). Hold time refers to a minimum duration of time the signal of interest is to stay at the desired level after an edge of a clock signal, for example, to enable proper sampling. Pulse width refers to a minimum pulse duration the reference/constraining signal (e.g. clock signal) needs to stay at a desired signal level for a signal of interest to be sampled accurately by a sequential component.

A prior approach may consume a substantial amount of time to measure constraint parameters while designing integrated circuits. For example, in a common design cycle, a component is represented in the form of digital data, and input signals are applied to the component assuming a specific value for a constraint parameter. The output of the component is examined to determine if the component would operate accurately with the constraint parameter. Several iterations of applying input signals (with different values for the constraint parameter), may be performed to determine an accurate value for the constraint parameter. In general, the time to design an integrated circuit increases with an increase in the number of iterations.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

An aspect of the present invention reduces the time to measure constraint parameters of a component by first measuring delay between a pair of nodes forming a part of an entire path from an input to an output (of the component). The measured delay is used to determine an optimal range in which the actual value of a constraint parameter is present. The actual value of a constraint parameter may be determined by applying signals, each signal conforming to a value of the parameter within the optimal range, and observing the output (of the component) for correctness according to the logical utility (also known as function) of the component.

As the range of values is determined based on the measured delay, the approximate range can be estimated in a short range accurately. As a result, the number of signals to be applied for determining the correct value may also be small. Thus, the time to determine the constraint parameters may be reduced. The advantages of the described embodiments will be clearer from an understanding of a prior approach which may not use at least some features of the present invention. Accordingly, a prior approach is described first with reference to example components and corresponding example constraint parameters.

2. Prior Approach in an Example Component

Figure 1:
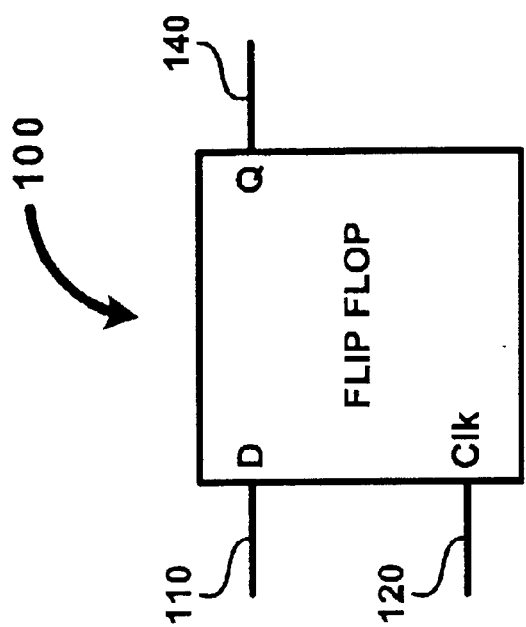
FIG. 1 is a block diagram of a D flip-flop illustrating the details of a prior art.

FIG. 1 is a block diagram illustrating the basic operation of D flip-flop 100. D flip-flop 100 is used to illustrate some prior approaches. D flip-flop 100 is shown receiving D-input 110 and clk-input 120, and generating Q-output 140 in response.

D flip-flop 100 transfers the signal received on D-input 110 to Q-output when clk-input 120 transitions from a logical low to high. Thus, the signal at Q-output on path 140 may be similar to the signal to D-input but appears after certain delay. The constraint parameters of D flip-flop 100 are illustrated below with reference to FIG. 2.

Figure 2:
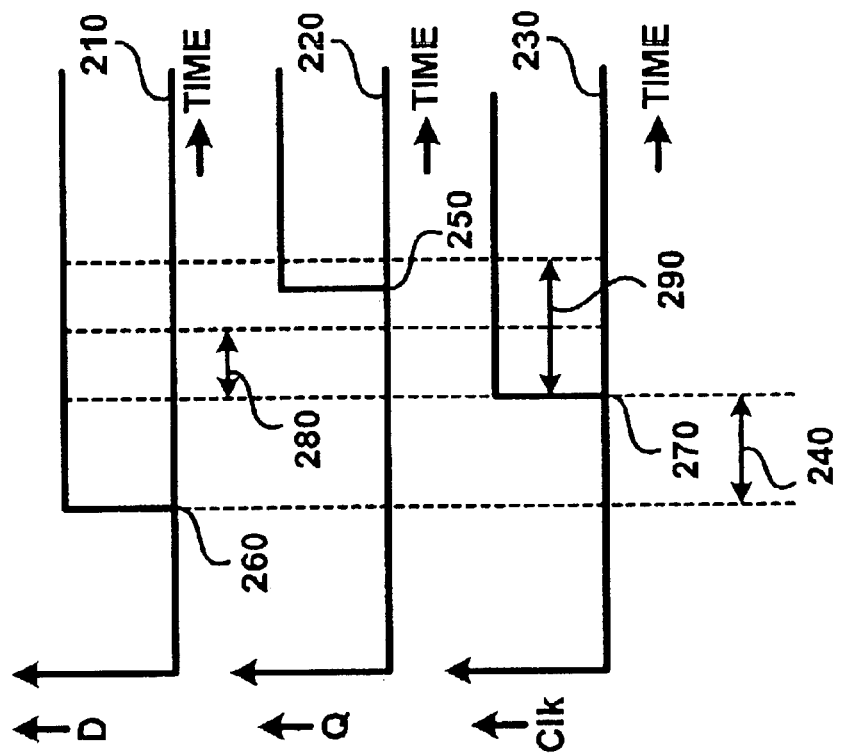
FIG. 2 is a timing diagram illustrating the details of the function and constraint parameters of the D flip-flop.

FIG. 2 is a timing diagram illustrating example constraint parameters with reference to operation of D flip-flop 100. FIG. 2 is shown containing three lines 210, 220 and 230 representing the signal to D-input on path 110, Q-output on path 140 and clk-input on path 120 respectively.

Setup time refers to a minimum time duration D-input 110 has to change ahead of a time point at which the signal to clk input 120 changes. Duration 240 represents a duration between CLK 230 going high and D-input 110 has changed, and the minimum permissible corresponding duration refers to as setup time. In addition, the signal on D-input 110 needs to be at a logic high to transfer to Q-output for certain time duration after an edge (at time point 270) of clk-input 120. The corresponding time duration is is shown with numeral 280, and the corresponding minimum permissible duration is referred to as hold time. Similarly, clk-input 120 needs to be at a logic level for a minimum pulse duration to transfer D-input 110 to Q-output 140. The corresponding pulse duration is termed as pulse width, and is shown as Tw 290.

Assuming for illustration that D flip-flop 100 is provided in a cell library, the constraint parameters of D flip-flop 100 may be of interest to a designer implementing a product using D flip-flop 100 in the cell library. However, the parameters may not be available to the designer (in the cell library or elsewhere). Accordingly it may be desirable to quickly determine the parameters.

In one prior approach, a binary search algorithm may be used to measure setup time Tsu 240. Broadly, the binary search algorithm may be performed in a large search range to measure the setup time for all process temperatures and voltages (PTV), and slew combinations. In a first iteration, a transition is caused on D-input 110 and a transition on clk-input 120 is caused after certain time period within the search range.

Q-output 140 is observed (e.g., using SPICE simulator, well known in the relevant arts) to determine whether the transition is propagated or not. If the transition is not propagated, the setup time used in the corresponding iteration is deemed to be inadequate. If the transition is propagated, the setup time used at least equals the minimum setup time with which flip-flop 100 can operate. Similar searches may be performed iteratively until the correct/accurate setup time is determined. Other constraint parameters Thold 280 and Tw 290 may also be similarly determined.

One problem with the above approach is that it may be necessary to use a large approximate range to measure the possible actual values for the constraint parameter. The large range to search generally leads to a correspondingly long time to determine the actual value. Accordingly, it is desirable to minimize the time to measure constraint parameters. The present invention enables such minimization in the measurement of constraint parameters as described below in detail.

Several aspects of the invention are described with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

3. Method

Figure 3:
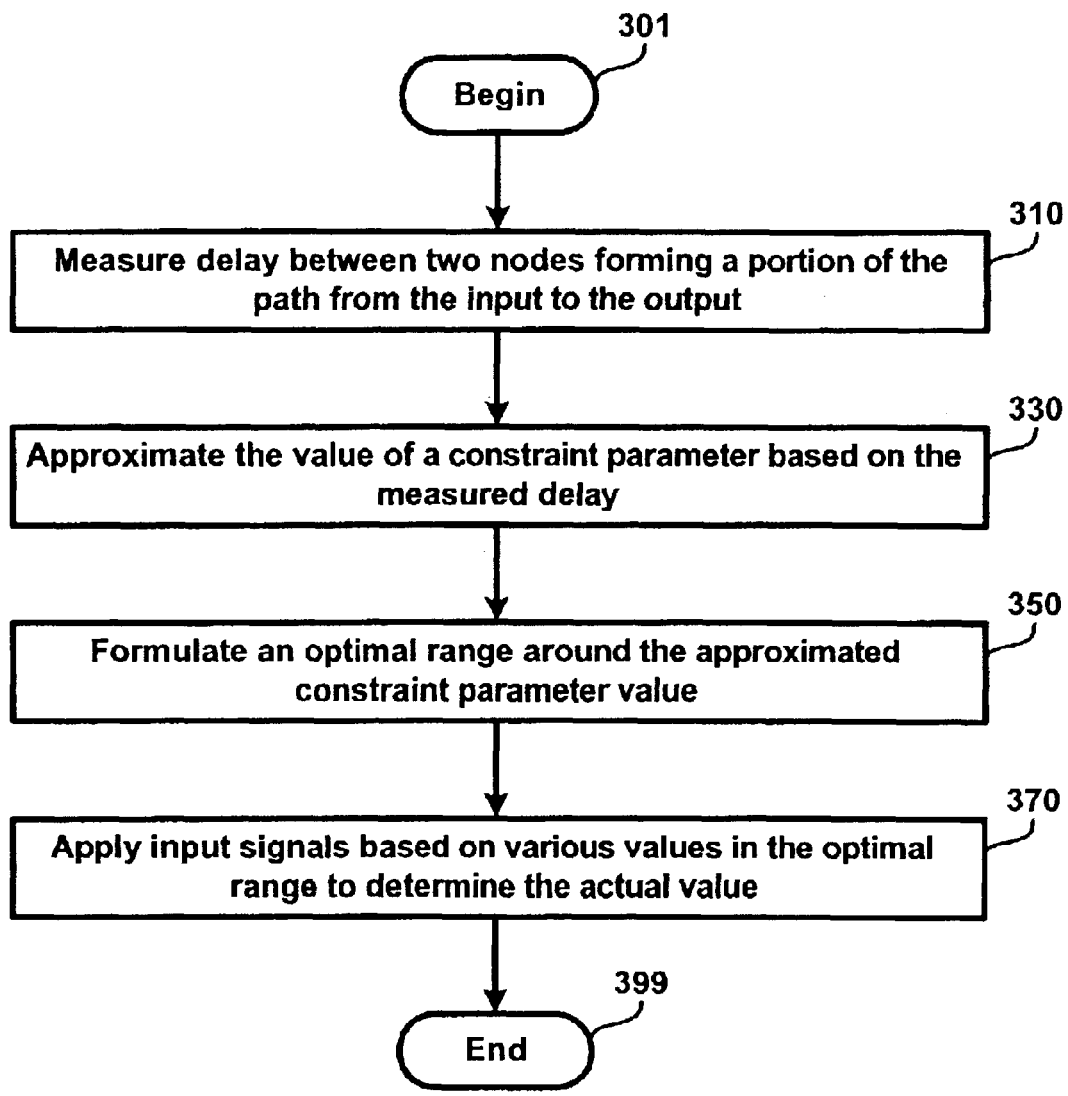
FIG. 3 is a flowchart illustrating the details of a method in which the time to measure constraint parameters may be reduced according to an aspect of the present invention.

FIG. 3 is a flowchart illustrating the details of a method using which the time to measure constraint parameter may be reduced according to an aspect of the present invention. For illustration, the method is described with reference to FIG. 1. However, the method can be implemented in several other embodiments as will be apparent to one skilled in the relevant arts based on the disclosure provided herein. The method begins in step 301 in which control passes to step 310.

In step 310, the delay between two nodes forming a portion of the path from the input to the output of a component (e.g., D flip-flop 100) may be measured. In general, an input signal is applied at a first node and the time taken for the input signal to propagate to a second node is determined.

Various approaches may be employed in selecting the two nodes. In an embodiment described below, the input terminal is conveniently chosen as one of the two nodes since the input terminal provides a convenient point at which various signals can be applied and measurements taken. The second node is selected at an internal point at which the signals have stability and can be examined for attainment of desired logical states. For example, for a D flip-flop implemented as a master slave latch, the second node is selected as a connecting point of the master latch and slave latch.

In step 330, an approximate value for the constraint parameter is determined based on the delay measured in step 310. Example equations for determining various constraint parameters are described below in further detail. Some of the equations may entail measuring other delays as well.

In step 350, an optimal range to search for the actual value of constraint parameter is formulated using the approximated value of constraint parameter. In general, a narrow range would lead to minimization of the number of searches. However, if the actual value is not within the range (due to error in computation, etc.), additional computations may need to be performed to search outside of the optimal range. As a result, the time to compute the constraint parameter may become higher. In an embodiment, if the approximated value of constraint parameter is 'A', then the optimal range is formulated as (0.8×A) to (1.2×A), where '×' represents multiplication.

In step 370, input signals are applied based on various values in the optimal range to determine the actual value of a constraint parameter. For example, a transition on clk-input 120 is caused at different time points (in different iteration within the optimal range) with reference to a transition on D-input 110 till the actual value of setup time is determined. In other words, the output signal(s) generated by the component are examined to determine whether the component would be operational (perform the corresponding function) with the corresponding value in the optimal. Similarly, the time points at which the transitions on input signals are applied may be changed to determine the actual values for hold time and pulse width. The method ends in step 399.

However, in some situations, the constraint parameter may not lie in the optimal range formulated in step 350. In such a situation, a dynamic range recovery algorithm is applied, in which the optimal range may be increased in both directions (i.e., lowering the lower limit and increasing the upper limit). The actual value of the constraint parameter may be determined as described in step 370 by searching in the new search range. The search range may be increased until the actual value for the dynamic range is determined.

From the above, it may be appreciated that the search range may be reduced by identifying the internal node and thus the time to measure constraint parameter may be reduced. However, the circuits in which the internal nodes cannot be identified, a small value for the optimal range may be formulated as dynamic range recovery algorithm may increase the search range if the constraint parameter doesn't lie in the optimal range. An example implementation of the method of FIG. 3 is described below.

4. Example Component

Figure 4A:
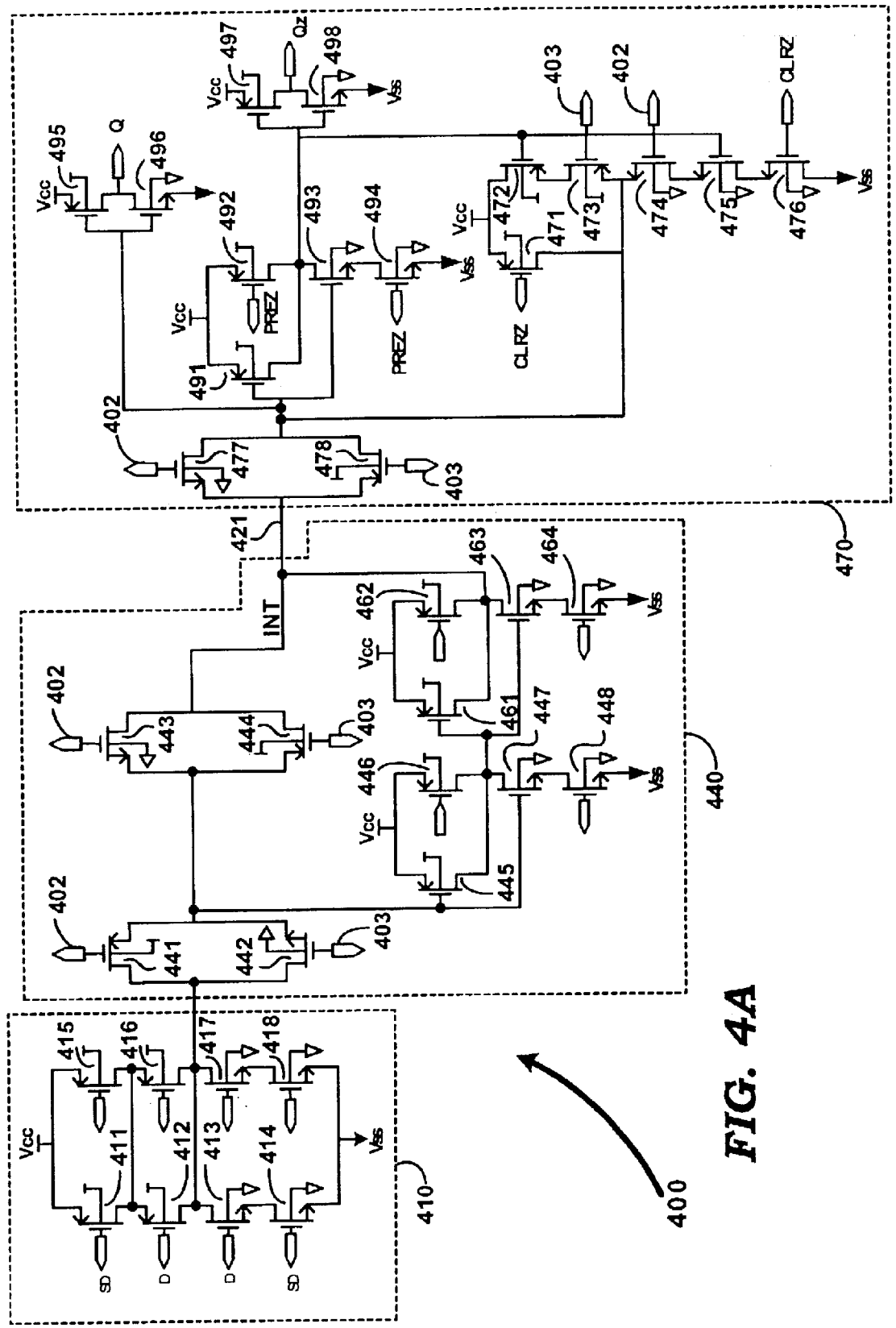
FIG. 4A is a circuit diagram of a scan flip-flop illustrating an example component in which the present invention can be implemented.

FIG. 4A is a circuit diagram of a scan flip-flop 400 illustrating an example component in which the present invention can be implemented. In general, scan flip-flop 400 represents a D flip-flop with additional circuitry provided for testing as described below. Scan flip-flop 400 is shown containing multiplexer 410, master latch 440 and slave latch 470. Each component is described below.

Scan flip-flop 400 operates as a D flip-flop in functional mode and as a scan flip-flop in test mode (e.g., using ATPG technique). Scan flip-flop 400 receives input signals D, SD (scan data), CLK and SCAN and provides output Q and QZ. When SCAN input is asserted, the flip-flop operates in a test mode, and in functional (non-test) mode otherwise. The input signal D provides input in non-test mode and SD provides input in the test mode. The selected signal of D or SD is provided as output Q. Output QZ represents the complement of Q.

Multiplexer 410 selects either input data D or scan data SD, and provides the selected data to master latch 440. The selection of the specific input is controlled by SCAN input. Scan data SD is selected when SCAN input is high (scan mode) and input data D is selected when SCAN input is at logic low.

Multiplexer 410 is shown containing four PMOS transistors 411, 412, 415, and 416, and four NMOS transistors 413, 414, 417 and 418. Each of transistors 412 and 413 receives D input and each of transistors 415 and 417 receives SD input on their respective gate terminals. Each of transistors 411 and 418 receives SCAN input and each of transistors 414 and 416 receives complement of SCAN input (SCANZ) on their respective gate terminals.

In test mode, when SCAN input is at logic high (SCANZ is at logic low), transistors 416 and 418 are turned on, which causes SD input to be selected. In non-test mode, when SCAN input is at logic low (SCANZ is at logic high), transistors 411 and 414 are turned on, which causes to select D input.

Master latch 440 receives input signal from multiplexer 410 and provides the same signal on path 421 in a master latch enabled state. A master latch enabled state is present when CKB 402 is at logic low and CKZ 403 is at logic high. CKB 402 and CKZ 403 are complement to each other and are generated from CLK input signal. It may be appreciated that master latch enabled state is present during half cycle of flip-flop input clock CLK.

Master latch 440 is shown containing first pass gate (formed by PMOS transistor 441 and NMOS transistor 442), second pass gate (formed by PMOS transistor 444 and NMOS transistor 443), first inverter formed by NAND gate containing transistors 445, 446, 447, and 448, and second inverter formed by NAND gate containing transistors 461, 462, 463, and 464. First pass gate is closed when CKB 402 is at logic low and CKZ 403 is at logic high since the gate terminals of PMOS transistor 441 and NMOS transistor 442 are respectively coupled to CKB 402 and CKZ 403. In the closed state, first pass gate passes the signal received from multiplexer 410, and the passed signal is further propagated through first and second inverters to slave latch 470. In the same duration, second pass gate is open.

First pass gate is open when CKB 402 is at logic high and CKZ 403 is at logic low. In the same duration, second pass gate is closed. The combination of first inverter, second inverter and second pass gate operate to hold the previous data which was transferred when CKB 402 was at logic low.

Slave latch 470 receives input signal on path 421 and provides the outputs Q and QZ in a slave latch enabled state. A slave latch enabled state is present when CKB 402 is at logic (logical) high and CKZ 403 is at logic low. It may be further appreciated that the slave latch enabled state is present during one half of flip-flop input clock CLK and the master latch enabled state is present in the other half.

Slave latch 470 is shown containing third pass gate (formed by transistors 477 and 478), third inverter formed by transistors 495 and 496, fourth inverter formed by transistors 497 and 498, third NAND gate formed by transistors 491, 492, 493 and 494, a fourth logic gate formed by transistors 471, 472, 473, 474, 475, and 476. Third pass gate is in a closed state when CKB 402 is at logic high and CKZ 403 is at logic low since the gate terminal of NMOS transistor 477 and PMOS transistor 478 are respectively coupled to CKB 402 and CKZ 403. In the closed state, the input signal on path 421 is passed to generate output QZ and Q.

Each of transistors 492 and 494 receive PREZ signal and each of transistors 471 and 476 receives CLRZ signal on the respective base terminals. The PREZ and CLRZ signals cause scan flip-flop 400 to generate a value on output Q and QZ independent of the input signals D and SD.

Therefore, master latch 440 receives signal from multiplexer 410 and provides the same signal to slave latch 470 on path 421 when CKB 402 is at logic low. Slave latch 470 provides the received signal on path 421 as output Q when CKB 402 is at logic high. Thus, it may be appreciated that the signal on path 421 does not change when CKB 402 is at a logic high even if the input signal changes. The manner in which CKB 402 and CKZ 403 can be generated is described below with reference to FIG. 4B.

Figure 4B:
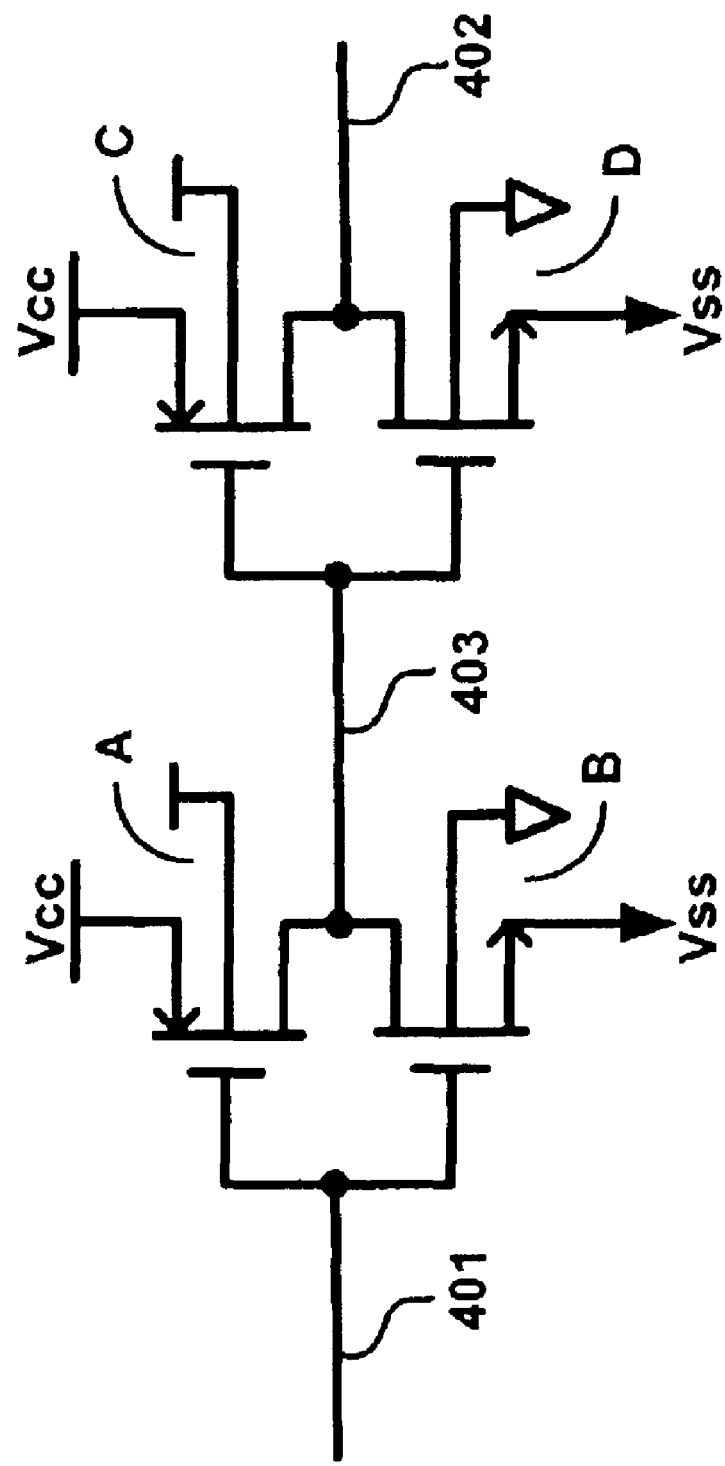
FIG. 4B is a circuit diagram illustrating the details of generating clock signals to the scan flip-flop.

FIG. 4B is a circuit diagram illustrating the details of generating clock signals CKB 402 and CKZ 403 from CLK 401. Transistors A and B form a CMOS inverter and transistors C and D form another CMOS inverter. Each of transistors A and B receive CLK 401 on their respective gate terminals and provide CLKZ on path 403, which is an inverted CLK 401. Similarly, each of transistors C and D receive CLKZ 403 on their respective gate terminals and provide CLKB on path 402, which is a delayed CLK 401. Therefore, CLKB 402 and CLKZ 403 are compliments to each other.

Continuing with reference to FIG. 4A, constraint parameters of scan flip-flop 400 may be measured by selecting a node on path 421 (which connects master latch 440 to slave latch 470). As noted above, master latch 440 provides the input signal (D or SD) on path 421 during one half cycle of CLK 401 and slave latch transfers the same signal to output Q during next half cycle of CLK 401. The signal on path 421 would be stable in between the transfer.

The delay of the input signals to reach path 421 may be measured to estimate the constraint parameters. Additional accuracy in estimation may be achieved by measuring additional delays as described below in further detail with reference to FIG. 6.

5. Increasing Accuracy of Estimation

Figure 6:
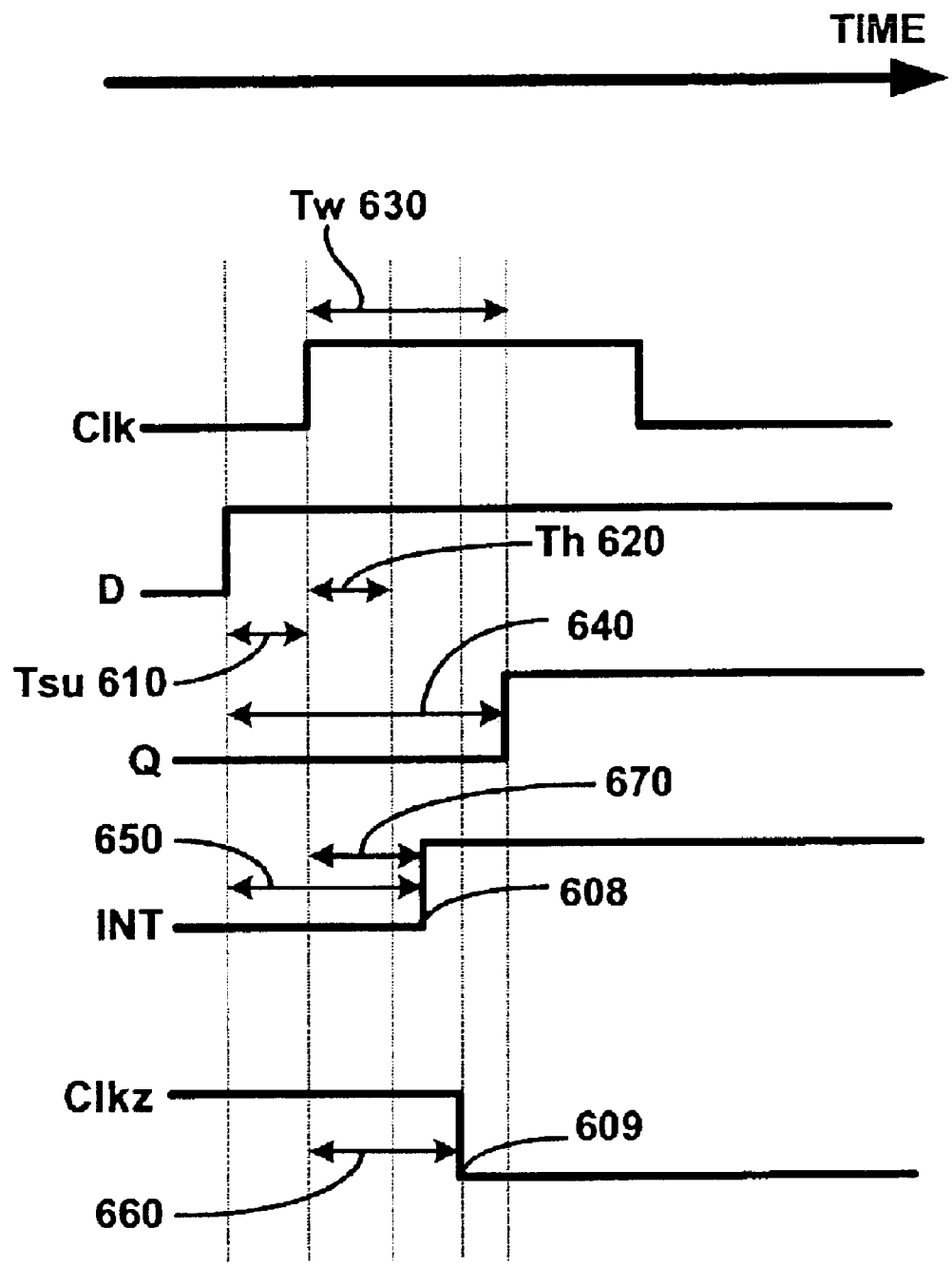
FIG. 6 is a timing diagram illustrating the timing relationship of various signals used to estimate the constraint parameters of a flip-flop.

FIG. 6 is a timing diagram illustrating the general timing relationship of various signals of FIGS. 4A and 4B. The timing diagram is shown containing CLK (401), D, Q, INT and CLKZ (403) signals. The signals are described in further details.

Setup time (Tsu 610), hold time (Th 620) and pulse width are shown for understanding the parameters. The setup time is shown as a duration between the rise of the D signal and the following rise of the CLK signal. The hold time is shown being measured from the rise of the D signal. The pulse width is shown being measured from the rise of the CLK signal. The manner in which the three constraint parameters can be estimated accurately is described below.

In an embodiment, the setup time is estimated according to the following equation:

Estimation of Setup time=
Time duration 650−Time duration 660   Eq. (1)

wherein time duration 650 represents the amount of time taken for an input signal D to arrive (propagate and settle) at the internal node on path 421. Time duration 660 represents an amount of time taken for a transition on CLK signal to arrive at CLKZ. As may be appreciated from FIG. 6, the setup time may be approximated using Equation (1). Due to such estimation, the setup time may be accurately determined in a few iterations.

According to another aspect of the present invention, the hold time is also approximated using Equation (1). The underlying rationale may be appreciated by understanding that hold time (like setup time) depends on how fast CLK reaches CLKZ with respect to how fast D reaches INT. For illustration, assume that the D signal is removed after some time of CLK active transition. If D reaches INT faster than CLK reaches CLKZ, then wrong value will be latched. Thus, as in the case of setup time, Equation (1) may be used to approximate the hold time as well.

According to one more aspect of the present invention, the pulse width is estimated according to the following equation:

$$\text{Estimation of pulse width} = \text{Time duration } 650 + \text{Time duration } 660 \quad \text{Eq. (2),}$$

wherein time durations 650 and 660 are described above with reference to Equation (1).

Equation (2) may be appreciated by understanding that the pulse width needs to be long enough to make sure that D transitions arrive INT before clock CLK removal (clock inactivation) reaches CLKZ, which ensures that D reaches output in one clock pulse. In an alternative embodiment, pulse width may be estimated (approximated) according to the following equation:

$$\text{Estimation of pulse width} = \text{Higher one of the two values}$$
$$(\text{Time Duration } 650 \text{ and } 2*\text{Time Duration } 660) \quad \text{Eq. (3)}$$

wherein * represents a multiplication operation. Instead, as time duration 650 is generally more than time duration 660, Equation (2) may be employed as a more conservative estimate of the pulse width.

Thus, using the above equations, the constraint parameters may be estimated. An optimal range is then formulated and accurate values are determined, for example, as described with reference to FIG. 4.

The determination of constraint parameters can be used in several environments. For example, in software based systems used to design integrated circuits, the constraint parameters can be determined to characterize various cells in a library. The results of characterization generally facilitate a determination of whether a specific cell can be used (in combination with other cells) in an integrated circuit. At least in such environments, the constraint parameters can be determined in a computer system. An example implementation of such a computer system is described below in further detail.

6. Computer System

Figure 5:
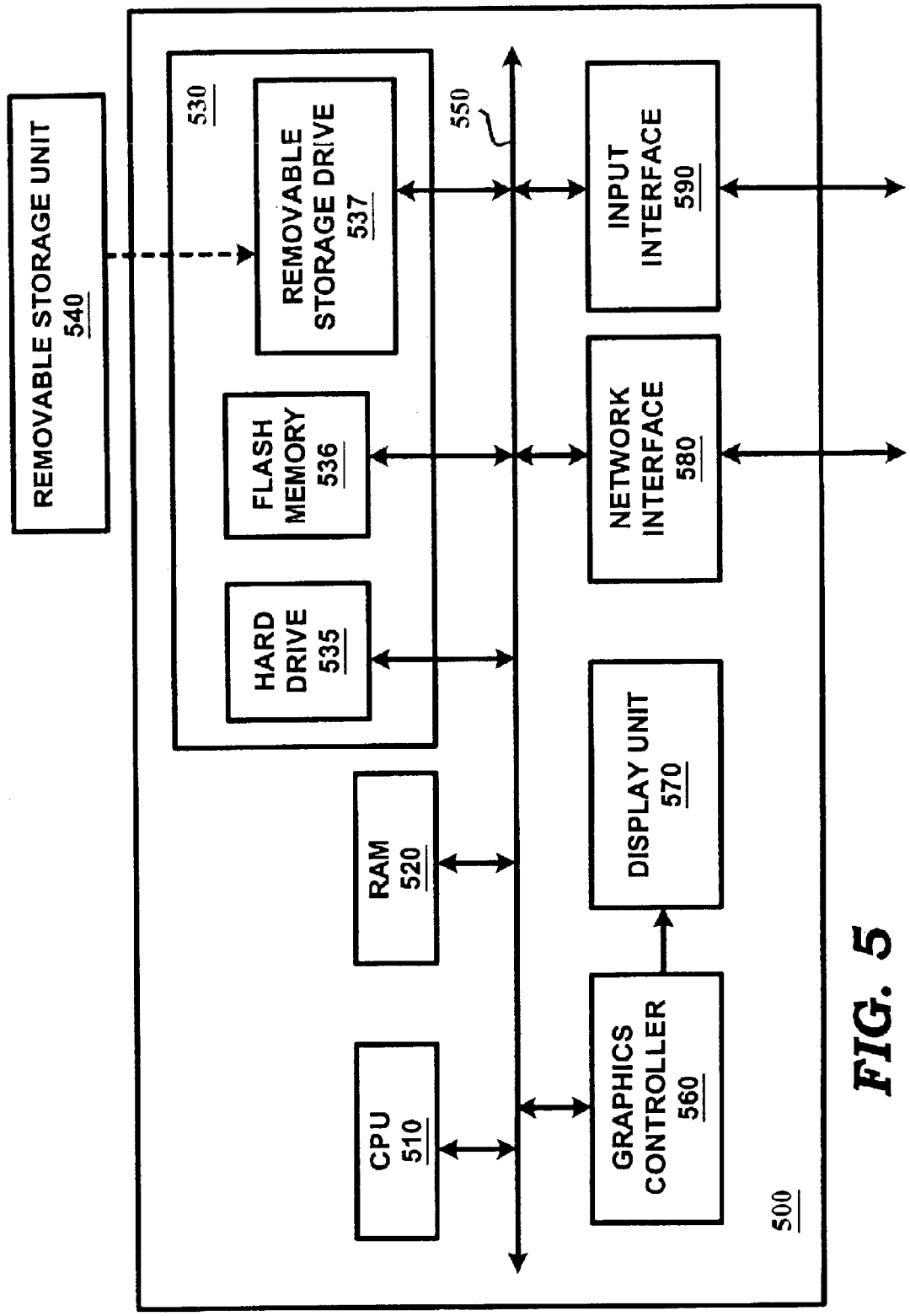
FIG. 5 is a block diagram of a computer system illustrating a typical environment for implementing the present invention.

FIG. 5 is a block diagram of computer system 500 illustrating an example environment for implementing the present invention. Computer system 500 may contain one or more processors such as central processing unit (CPU) 510, random access memory (RAM) 520, secondary memory 530, graphics controller 560, display unit 570, network interface 580, and input interface 590. All the components except display unit 570 may communicate with each other over communication path 550, which may contain several buses as is well known in the relevant arts. The components of FIG. 5 are described below in further detail.

CPU 510 may execute instructions stored in RAM 520 to provide several features of the present invention. CPU 510 may contain multiple processing units, with each processing unit potentially being designed for a specific task. Alternatively, CPU 510 may contain only a single processing unit. RAM 520 may receive instructions from secondary memory 530 using communication path 550. Data representing various cell libraries may be stored and retrieved from secondary memory 530 (and/or RAM 520) during the execution of the instructions.

Graphics controller 560 generates display signals (e.g., in RGB format) to display unit 570 based on data/instructions received from CPU 510. Display unit 570 contains a display screen to display the images defined by the display signals. Input interface 590 may correspond to a key-board and/or mouse, and generally enables a user to provide inputs. Network interface 580 enables some of the inputs (and outputs) to be provided on a network. In general, display unit 570, input interface 590 and network interface 580 enable a user to design integrated circuits, and may be implemented in a known way.

Secondary memory 530 may contain hard drive 535, flash memory 536 and removable storage drive 537. Secondary storage 530 may store the software instructions and data (e.g., interconnections of modules), which enable computer system 500 to provide several features in accordance with the present invention. Some or all of the data and instructions may be provided on removable storage unit 540, and the data and instructions may be read and provided by removable storage drive 537 to CPU 510. Floppy drive, magnetic tape drive, CD-ROM drive, DVD Drive, Flash memory, removable memory chip (PCMCIA Card, EPROM) are examples of such removable storage drive 537.

Removable storage unit 540 may be implemented using medium and storage format compatible with removable storage drive 537 such that removable storage drive 537 can read the data and instructions. Thus, removable storage unit 540 includes a computer readable storage medium having stored therein computer software and/or data. An embodiment of the present invention is implemented using software running (that is, executing) in computer system 500.

In this document, the term "computer program product" is used to generally refer to removable storage unit 540 or hard disk installed in hard drive 535. These computer program products are means for providing software to computer system 500. As noted above, CPU 510 may retrieve the software instructions, and execute the instructions to provide various features of the present invention. The features of the present invention are described above in detail.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of measuring a constraint parameter of a component in an integrated circuit represented in digital form, said method comprising:

measuring a first delay between two nodes forming a portion of a path from an input terminal to an output terminal of said component;

determining an approximate value of said constraint parameter based on said first delay;

formulating an optimal range around said approximate value for said constraint parameter;

applying an input signal to said component based on a possible value for said constraint parameter, wherein said possible value is contained in said optimal range;

examining an output signal generated by said component to determine whether said component would be operational with said possible value for said constraint parameter;

wherein said component comprises a flip-flop and wherein said two nodes comprise said input terminal and a node connecting two latches forming said flip-flop;

measuring a second delay in generating an inverted clock signal from a clock signal, wherein said clock signal and said inverted clock signal are provided as inputs to transistors contained in said flip-flop; and wherein said constraint parameter comprises a pulse width of the clock signal and said approximate value is computed by adding said second delay and said first delay.

2. A machine readable medium carrying one or more sequences of instructions for causing a system to measure a constraint parameter of a component in an integrated circuit represented in digital form, wherein execution of said one or more sequences of instructions by one or more processors contained in said server causes said one or more processors to perform the actions of:

measuring a first delay between two nodes forming a portion of a path from an input terminal to an output terminal of said component;

determining an approximate value of said constraint parameter based on said first delay;

formulating an optimal range around said approximate value for said constraint parameter;

applying an input signal to said component based on a possible value for said constraint parameter, wherein said possible value is contained in said optimal range;

examining an output signal generated by said component to determine whether said component would be operational with said possible value for said constraint parameter;

wherein said component comprises a flip-flop and wherein said two nodes comprise said input terminal and a node connecting two latches forming said flip-flop;

measuring a second delay in generating an inverted clock signal from a clock signal, wherein said clock signal and said inverted clock signal are provided as inputs to transistors contained in said flip-flop; and wherein said constraint parameter comprises a pulse width of the clock signal and said approximate value is computed by adding said second delay and said first delay.

3. An apparatus for measuring a constraint parameter of a component in an integrated circuit represented in digital form, said apparatus comprising:

means for measuring a first delay between two nodes forming a portion of a path from an input terminal to an output terminal of said component;

means for determining an approximate value of said constraint parameter based on said first delay;

means for formulating an optimal range around said approximate value for said constraint parameter;

means for applying an input signal to said component based on a possible value for said constraint parameter, wherein said possible value is contained in said optimal range;

means for examining an output signal generated by said component to determine whether said component would be operational with said possible value for said constraint parameter;

wherein said component comprises a flip-flop and wherein said two nodes comprise said input terminal and a node connecting two latches forming said flip-flop;

measuring a second delay in generating an inverted clock signal from a clock signal, wherein said clock signal and said inverted clock signal are provided as inputs to transistors contained in said flip-flop;

wherein said constraint parameter comprises a pulse width of the clock signal and said approximate value is computed by adding said second delay and said first delay.

* * * * *